(12) United States Patent
Fogelson et al.

(10) Patent No.: US 7,183,630 B1
(45) Date of Patent: Feb. 27, 2007

(54) LEAD FRAME WITH PLATED END LEADS

(75) Inventors: Harry J. Fogelson, Tempe, AZ (US); Ludcvico Estrada Bancod, Chandler, AZ (US); Ahmer Syed, Chandler, AZ (US); Terry Davis, Gilbert, AZ (US); Primitivo A. Palasi, Baguio (PH); William M. Anderson, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 10/459,230

(22) Filed: Jun. 11, 2003

Related U.S. Application Data

(63) Continuation of application No. 10/122,598, filed on Apr. 15, 2002, now Pat. No. 6,608,366.

(51) Int. Cl.
*H01L 23/495* (2006.01)

(52) U.S. Cl. .................................. 257/666

(58) Field of Classification Search ........ 257/666–690, 257/734–738
See application file for complete search history.

(56) References Cited

U.S. PATENT DOCUMENTS

| | | | |
|---|---|---|---|
| 5,703,407 A | 12/1997 | Hori | |
| 5,710,064 A | 1/1998 | Song et al. | |
| 5,723,899 A | 3/1998 | Shin | |
| 5,736,432 A | 4/1998 | Mackessy | |
| 5,745,984 A | 5/1998 | Cole, Jr. et al. | |
| 5,753,977 A | 5/1998 | Kusaka et al. | |
| 5,763,940 A * | 6/1998 | Shibusawa et al. | 257/668 |
| 5,766,972 A | 6/1998 | Takahashi et al. | |
| 5,770,888 A | 6/1998 | Song et al. | |
| 5,776,798 A | 7/1998 | Quan et al. | |
| 5,783,861 A | 7/1998 | Son | |
| 5,801,440 A | 9/1998 | Chu et al. | |
| 5,814,877 A | 9/1998 | Diffenderfer et al. | |
| 5,814,881 A | 9/1998 | Alagaratnam | |
| 5,814,883 A | 9/1998 | Sawai et al. | |
| 5,814,884 A | 9/1998 | Davis et al. | |
| 5,817,540 A | 10/1998 | Wark | |
| 5,818,105 A | 10/1998 | Kouda | |
| 5,821,457 A | 10/1998 | Mosley et al. | |
| 5,821,615 A | 10/1998 | Lee | |
| 5,834,830 A | 11/1998 | Cho | |
| 5,835,988 A | 11/1998 | Ishii | |

(Continued)

FOREIGN PATENT DOCUMENTS

DE    1973494 A1    8/1997

(Continued)

*Primary Examiner*—Nathan W. Ha
(74) *Attorney, Agent, or Firm*—Stetina Brunda Garred & Brucker

(57) ABSTRACT

A lead frame comprising a frame which defines a central opening. Disposed within the central opening is a die pad which is connected to the frame. Also connected to the frame are a plurality of leads which extend within the opening toward the die pad. Each of the leads defines opposed top and bottom surfaces, an inner end, an outer end, and an opposed pair of side surfaces. The bottom surface and the outer end collectively define a corner region of the lead. Formed within the corner region is a recess which is sized and configured to accommodate the flow of reflow solder thereinto.

20 Claims, 7 Drawing Sheets

U.S. PATENT DOCUMENTS

| | | | |
|---|---|---|---|
| 5,844,306 A | 12/1998 | Fujita et al. | |
| 5,856,911 A | 1/1999 | Riley | |
| 5,859,471 A | 1/1999 | Kuraishi et al. | |
| 5,866,939 A | 2/1999 | Shin et al. | |
| 5,871,782 A | 2/1999 | Choi | |
| 5,874,784 A | 2/1999 | Aoki et al. | |
| 5,877,043 A | 3/1999 | Alcoe et al. | |
| 5,886,397 A | 3/1999 | Ewer | |
| 5,886,398 A | 3/1999 | Low et al. | |
| 5,894,108 A | 4/1999 | Mostafazadeh | |
| 5,897,339 A | 4/1999 | Song et al. | |
| 5,900,676 A | 5/1999 | Kweon et al. | |
| 5,903,049 A | 5/1999 | Mori | |
| 5,903,050 A | 5/1999 | Thurairajaratnam et al. | |
| 5,917,242 A | 6/1999 | Ball | |
| 5,939,779 A | 8/1999 | Kim | |
| 5,942,794 A | 8/1999 | Okumura et al. | |
| 5,951,305 A | 9/1999 | Haba | |
| 5,959,356 A | 9/1999 | Oh | |
| 5,969,426 A | 10/1999 | Baba et al. | |
| 5,973,388 A | 10/1999 | Chew et al. | |
| 5,976,912 A | 11/1999 | Fukutomi et al. | |
| 5,977,613 A | 11/1999 | Takata et al. | |
| 5,977,615 A | 11/1999 | Yamaguchi et al. | |
| 5,977,630 A | 11/1999 | Woodworth et al. | |
| 5,981,314 A | 11/1999 | Glenn et al. | |
| 5,986,333 A | 11/1999 | Nakamura | |
| 5,986,885 A | 11/1999 | Wyland | |
| 6,001,671 A | 12/1999 | Fjelstad | |
| 6,018,189 A | 1/2000 | Mizuno | |
| 6,025,640 A | 2/2000 | Yagi et al. | |
| 6,031,279 A | 2/2000 | Lenz | |
| RE36,613 E | 3/2000 | Ball | |
| 6,034,423 A | 3/2000 | Mostafazadeh | |
| 6,040,626 A | 3/2000 | Cheah et al. | |
| 6,043,430 A | 3/2000 | Chun | |
| 6,060,768 A * | 5/2000 | Hayashida et al. | 257/666 |
| 6,060,769 A | 5/2000 | Wark | |
| 6,072,228 A | 6/2000 | Hinkle et al. | |
| 6,075,284 A | 6/2000 | Choi et al. | |
| 6,081,029 A | 6/2000 | Yamaguchi | |
| 6,084,310 A | 7/2000 | Mizuno et al. | |
| 6,087,722 A | 7/2000 | Lee et al. | |
| 6,100,594 A | 8/2000 | Fukui et al. | |
| 6,113,474 A | 9/2000 | Constantini et al. | |
| 6,118,174 A | 9/2000 | Kim | |
| 6,118,184 A | 9/2000 | Ishio et al. | |
| RE36,907 E | 10/2000 | Templeton, Jr. et al. | |
| 6,130,115 A | 10/2000 | Okumura et al. | |
| 6,130,473 A | 10/2000 | Mostafazadeh et al. | |
| 6,133,623 A | 10/2000 | Otsuki et al. | |
| 6,140,154 A | 10/2000 | Hinkle et al. | |
| 6,143,981 A | 11/2000 | Glenn | |
| 6,169,329 B1 | 1/2001 | Farnworth et al. | |
| 6,177,718 B1 | 1/2001 | Kozono | |
| 6,181,002 B1 | 1/2001 | Juso et al. | |
| 6,184,465 B1 | 2/2001 | Corisis | |
| 6,194,777 B1 | 2/2001 | Abbott et al. | |
| 6,197,615 B1 | 3/2001 | Song et al. | |
| 6,198,171 B1 | 3/2001 | Huang et al. | |
| 6,201,186 B1 | 3/2001 | Daniels et al. | |
| 6,201,292 B1 | 3/2001 | Yagi et al. | |
| 6,204,554 B1 | 3/2001 | Ewer et al. | |
| 6,208,020 B1 | 3/2001 | Minamio | |
| 6,208,021 B1 | 3/2001 | Ohuchi et al. | |
| 6,208,023 B1 | 3/2001 | Nakayama et al. | |
| 6,211,462 B1 | 4/2001 | Carter, Jr. et al. | |
| 6,218,731 B1 | 4/2001 | Huang et al. | |
| 6,222,258 B1 | 4/2001 | Asano et al. | |
| 6,225,146 B1 | 5/2001 | Yamaguchi et al. | |
| 6,229,200 B1 | 5/2001 | Mclellan et al. | |
| 6,229,205 B1 | 5/2001 | Jeong et al. | |
| 6,238,952 B1 * | 5/2001 | Lin | 438/110 |
| 6,239,384 B1 | 5/2001 | Smith et al. | |
| 6,242,281 B1 * | 6/2001 | Mclellan et al. | 438/106 |
| 6,256,200 B1 | 7/2001 | Lam et al. | |
| 6,258,629 B1 | 7/2001 | Niones et al. | |
| 6,281,566 B1 | 8/2001 | Magni | |
| 6,281,568 B1 | 8/2001 | Glenn et al. | |
| 6,282,095 B1 | 8/2001 | Houghton et al. | |
| 6,285,075 B1 | 9/2001 | Combs et al. | |
| 6,291,271 B1 | 9/2001 | Lee et al. | |
| 6,291,273 B1 | 9/2001 | Miyaki et al. | |
| 6,294,100 B1 | 9/2001 | Fan et al. | |
| 6,294,830 B1 | 9/2001 | Fjelstad | |
| 6,295,977 B1 | 10/2001 | Ripper et al. | |
| 6,297,548 B1 | 10/2001 | Moden et al. | |
| 6,303,984 B1 | 10/2001 | Corisis | |
| 6,303,997 B1 | 10/2001 | Lee | |
| 6,307,272 B1 | 10/2001 | Takahashi et al. | |
| 6,309,909 B1 | 10/2001 | Ohgiyama | |
| 6,316,838 B1 | 11/2001 | Ozawa et al. | |
| 6,323,550 B1 | 11/2001 | Martin et al. | |
| 6,326,243 B1 | 12/2001 | Suzuya et al. | |
| 6,326,244 B1 | 12/2001 | Brooks et al. | |
| 6,326,678 B1 | 12/2001 | Karnezos et al. | |
| 6,339,255 B1 | 1/2002 | Shin | |
| 6,348,726 B1 | 2/2002 | Bayan et al. | |
| 6,355,502 B1 | 3/2002 | Kang et al. | |
| 6,358,778 B1 * | 3/2002 | Shinohara | 438/123 |
| 6,369,454 B1 | 4/2002 | Chung | |
| 6,373,127 B1 | 4/2002 | Baudouin et al. | |
| 6,380,048 B1 | 4/2002 | Boon et al. | |
| 6,384,472 B1 | 5/2002 | Huang | |
| 6,388,336 B1 | 5/2002 | Venkateshwaran et al. | |
| 6,395,578 B1 | 5/2002 | Shin et al. | |
| 6,400,004 B1 * | 6/2002 | Fan et al. | 257/666 |
| 6,414,385 B1 | 7/2002 | Huang et al. | |
| 6,437,429 B1 | 8/2002 | Su et al. | |
| 6,444,499 B1 | 9/2002 | Swiss et al. | |
| 6,448,633 B1 | 9/2002 | Yee et al. | |
| 6,452,279 B2 | 9/2002 | Shimoda | |
| 6,464,121 B2 | 10/2002 | Reijnders | |
| 6,476,474 B1 | 11/2002 | Hung | |
| 6,482,680 B1 | 11/2002 | Khor et al. | |
| 6,498,099 B1 | 12/2002 | McLellan et al. | |
| 6,498,392 B2 | 12/2002 | Azuma | |
| 6,507,120 B2 | 1/2003 | Lo et al. | |
| 6,559,525 B2 | 5/2003 | Huang | |
| 6,700,188 B2 * | 3/2004 | Lin | 257/684 |
| 6,888,231 B2 * | 5/2005 | Maeda | 257/678 |
| 2001/0014538 A1 | 8/2001 | Kwan et al. | |
| 2002/0063315 A1 * | 5/2002 | Huang et al. | 257/666 |
| 2002/0066948 A1 * | 6/2002 | Kim | 257/678 |
| 2002/0079563 A1 * | 6/2002 | Shimanuki | 257/678 |
| 2002/0182773 A1 * | 12/2002 | Su et al. | 438/111 |
| 2003/0006055 A1 * | 1/2003 | Chien-Hung et al. | 174/52.1 |
| 2003/0073265 A1 * | 4/2003 | Hu et al. | 438/123 |
| 2003/0102537 A1 * | 6/2003 | McLellan et al. | 257/666 |
| 2003/0155638 A1 * | 8/2003 | Ito | 257/678 |
| 2004/0046240 A1 * | 3/2004 | Hasebe et al. | 257/678 |
| 2004/0140541 A1 * | 7/2004 | Shimanuki | 257/666 |
| 2005/0116321 A1 * | 6/2005 | Li et al. | 257/666 |

FOREIGN PATENT DOCUMENTS

| | | |
|---|---|---|
| EP | 54021117 | 6/1979 |
| EP | 59050939 | 3/1984 |
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |

| | | | | | | |
|---|---|---|---|---|---|---|
| EP | 0936671 | 8/1999 | | JP | 6260532 | 9/1994 |
| EP | 0989608 | 3/2000 | | JP | 7297344 | 11/1995 |
| EP | 1032037 | 8/2000 | | JP | 7312405 | 11/1995 |
| JP | 55163868 | 12/1980 | | JP | 864634 | 3/1996 |
| JP | 5745959 | 3/1982 | | JP | 8125066 | 5/1996 |
| JP | 58160095 | 8/1983 | | JP | 8222682 | 8/1996 |
| JP | 59208756 | 11/1984 | | JP | 8306853 | 11/1996 |
| JP | 59227143 | 12/1984 | | JP | 98205 | 1/1997 |
| JP | 60010756 | 1/1985 | | JP | 98206 | 1/1997 |
| JP | 60116239 | 8/1985 | | JP | 98207 | 1/1997 |
| JP | 60195957 | 10/1985 | | JP | 992776 | 4/1997 |
| JP | 60231349 | 11/1985 | | JP | 9293822 | 11/1997 |
| JP | 61395855 | 2/1986 | | JP | 10022447 | 1/1998 |
| JP | 629639 | 1/1987 | | JP | 10199934 | 7/1998 |
| JP | 63205935 | 8/1988 | | JP | 10256240 | 9/1998 |
| JP | 63233555 | 9/1988 | | JP | 00150765 | 5/2000 |
| JP | 63249345 | 10/1988 | | KR | 941979 | 1/1994 |
| JP | 63316470 | 12/1988 | | KR | 199772358 | 11/1997 |
| JP | 64054749 | 3/1989 | | KR | 100220154 | 6/1999 |
| JP | 1106456 | 4/1989 | | KR | 0049944 | 6/2002 |
| JP | 4098864 | 3/1992 | | WO | 9956316 | 11/1999 |
| JP | 5129473 | 5/1993 | | WO | 9967821 | 12/1999 |
| JP | 5166992 | 7/1993 | | | | |
| JP | 5283460 | 10/1993 | | | | |
| JP | 692076 | 4/1994 | | | | |

* cited by examiner

LEAD FRAME WITH PLATED END LEADS

RELATED APPLICATIONS

The present application is a continuation of U.S. application Ser. No. 10/122,598 entitled LEAD FRAME WITH PLATED END LEADS AND RECESSES filed Apr. 15, 2002 now U.S. Pat. No. 6,608,366.

STATEMENT RE: FEDERALLY SPONSORED RESEARCH/DEVELOPMENT (Not Applicable)

BACKGROUND OF THE INVENTION

The present invention relates generally to integrated circuit chip package technology, and more particularly to a unique lead frame design for a micro lead frame (MLF) package wherein a special plated half-etched feature is included in the lead frame design which increases the solderable area of the leads of the lead frame to a printed circuit board, thus creating stronger final solder joints with increased second level reliability.

Integrated circuit dies are conventionally enclosed in plastic packages that provide protection from hostile environments and enable electrical interconnection between the integrated circuit die and an underlying substrate such as a printed circuit board (PCB) or motherboard. The elements of such a package include a metal lead frame, an integrated circuit die, bonding material to attach the integrated circuit die to the lead frame, bond wires which electrically connect pads on the integrated circuit die to individual leads of the lead frame, and a hard plastic encapsulant material which covers the other components and forms the exterior of the package.

The lead frame is the central supporting structure of such a package. A portion of the lead frame is internal to the package, i.e., completely surrounded by the plastic encapsulant. Portions of the leads of the lead frame extend externally from the package or are partially exposed within the encapsulant material for use in electrically connecting the chip package to another component. In certain chip packages, a portion of the die pad of the lead frame also remains exposed within the exterior of the package for use as a heat sink.

For purposes of high-volume, low-cost production of chip packages, a current industry practice is to etch or stamp a thin sheet of metal material to form a panel or strip which defines multiple lead frames. A single strip may be formed to include multiple arrays, with each such array including a multiplicity of lead frames in a particular pattern. In a typical chip package manufacturing process, the integrated circuit dies are mounted and wire bonded to respective ones of the lead frames, with the encapsulant material then being applied to the strip so as to encapsulate the integrated circuit dies, bond wires, and portions of each of the lead frames in the above-described manner.

Upon the hardening of the encapsulant material, the lead frames within the strip are cut apart or singulated for purposes of producing the individual chip packages. Such singulation is typically accomplished via a saw singulation process. In this process, a saw blade is advanced along "saw streets" which extend in prescribed patterns between the lead frames as required to facilitate the separation of the lead frames from each other in the required manner.

As indicated above, in certain current MLF package designs, the bottom surface of each of the leads of the lead frame is exposed within the bottom surface of the package body formed by the hardening of the encapsulant material, with one end surface of each of the leads being exposed within a corresponding peripheral or side surface of the package body. In this design, solderable surfaces are provided on only the bottom surface of the package body, and more particularly, by the exposed bottom surfaces of the leads. The MLF package is attached to the printed circuit board or motherboard by printing solder paste on the board, positioning the exposed bottom surfaces of the leads upon the solder paste, and completing a hot reflow process. However, the limited solderable area on the MLF package and resultant decreased solder joint strength gives rise to reliability problems concerning the potential failure of one or more of the solder joints between the MLF package and the motherboard. Previous attempts to increase solder joint life were to optimize or increase the size of the leads, the material set, and the board design. However, material sets which give the best package level performance may also produce the worst board level performance, thus necessitating another option to increase overall solder strength and reliability between the MLF package and the motherboard.

The present invention addresses the solder joint reliability issue by providing a lead frame design wherein those surfaces of the leads exposed within the bottom and side surfaces of the package body are plated and configured in a manner allowing solder to reflow up the lead ends, thereby increasing the overall solder joint strength and reliability between the MLF package and motherboard. In this regard, the plated lead ends increase the solderable area of the leads of the MLF package to the motherboard, with the final solder joint being stronger with increased second level reliability.

The uniquely configured lead ends may be formed as a half-etched feature in the lead frame design. This half-etched design has the effect of increasing saw efficiency in the saw singulation process due to the resultant reduction of copper or other metal in the saw streets. The half-etched design further reduces the cut line interface between the saw and each of the leads, thus reducing the amount of burring which typically occurs upon the leads as a result of the saw singulation process. Saw generated burrs at the seating plan of each lead in the lead frame adversely affect solder mounting and joint reliability. In current MLF package fabrication methodologies, lead burrs are controlled by limiting the feed rate of the saw along the saw streets and by using specifically developed, high cost saw blades. The reduced burring attributable to the half-etched design of the lead ends increases output and allows for the use of lower cost saw blades.

As indicated above, as a result of forming the half-etched plated ends of the leads, metal material is removed from the saw streets, thus reducing the area of each of the leads susceptible to burring. This plated, half-etched feature in the present lead frame design becomes an integral part of the finished lead connection of the MLF package. The uniquely configured, plated ends of the leads of the lead frame constructed in accordance in accordance with the present invention may alternatively be formed through the implementation of a two-pass saw process, though such process does not provide the same saw cut efficiency and reduced burring attributes of the half-etched design. The half-etched or sawed leads can be incorporated into standard lead frame designs at no additional cost, and provide higher board-level (solder joint) reliability and improved lead dimensional stability. In the case of the half-etched leads, further advantages include the improvement of the saw singulation process (increased saw cut efficiency), and reduced burring on the saw cut leads as indicated above.

BRIEF SUMMARY OF THE INVENTION

In accordance with the present invention, there is provided a lead frame which comprises a frame defining a central opening. Disposed within the central opening is a die pad which is connected to the frame. Also connected to the frame are a plurality of leads which extend within the opening toward the die pad. Each of the leads defines opposed top and bottom surfaces, an inner end, an outer end, and an opposed pair of side surfaces. The bottom surface and the outer end collectively define a corner region of the lead. Formed within the corner region is a recess. The recesses facilitate the reflow of solder up the lead ends, thereby increasing the overall solder joint strength and reliability between the semiconductor package incorporating the lead frame and an underlying substrate such as a printed circuit board or motherboard. The surfaces of the lead defining the recess are plated, with the inclusion of the recess within each lead effectively increasing the solderable area of the leads of the semiconductor package to the printed circuit board, with the final solder joint being stronger with increased second level reliability.

The recesses within the leads may be formed as a half-etched feature in the lead frame design. This half-etched design has the effect of increasing saw efficiency in the saw singulation process due to the resultant reduction of copper or other metal material in the saw streets. The half-etched design further reduces the cut line interface between the saw and each of the leads, thus reducing the amount of burring which typically occurs upon the leads as a result of the saw singulation process.

Further in accordance with the present invention, there is provided a modified inboard design for a semiconductor package which is adapted to facilitate an increase in second level solder joint reliability by creating solder fillets upon those portions of the bottom surfaces of the leads which are exposed within the bottom surface of the package body. More particularly, the solder fillets are created by forming copper bumps upon the exposed bottom surfaces of each of the leads, the copper bumps facilitating the creation of solder fillets. Each of the copper bumps may optionally include a solder plate formed thereon.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
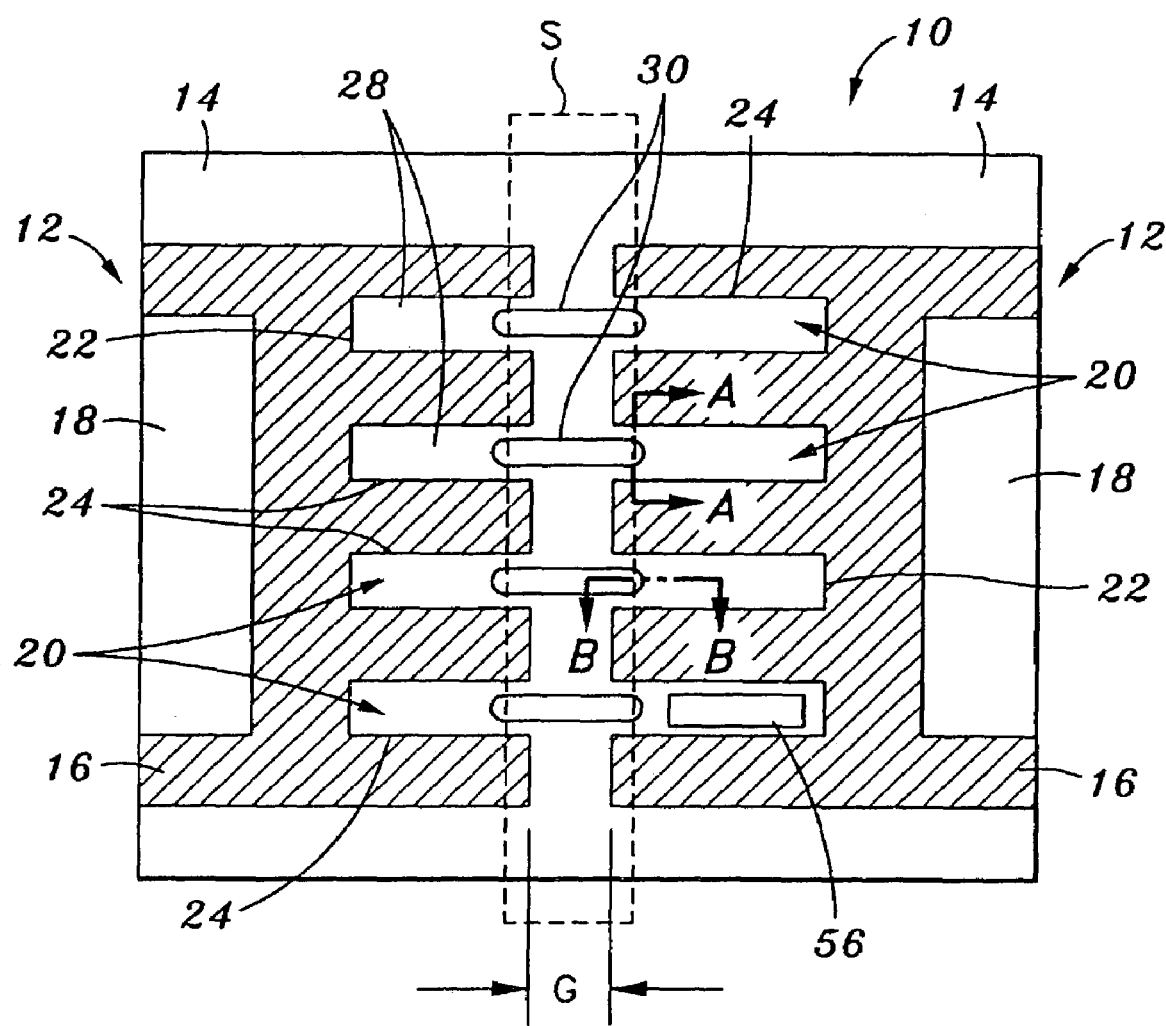
FIG. 1 is a partial top plan view of a lead frame strip defining multiple lead frames formed in accordance with a first embodiment of the present invention.

Referring now to the drawings wherein the showings are for purposes of illustrating preferred embodiments of the present invention only, and not for purposes of limiting the same, FIG. 1 depicts a lead frame strip 10 which is uniquely configured to facilitate the production of a multiplicity of lead frames 12 which are each formed in accordance with the present invention. The strip 10 has a generally rectangular configuration, defining opposed pairs of longitudinal and lateral peripheral edge segments. The strip 10 is typically formed to define multiple, identically configured arrays, with a portion of one such array being shown in FIG. 1. Each array defines a multiplicity of the lead frames 12.

Each lead frame 12 comprises an outer frame portion 14 which defines a centrally positioned opening 16. Disposed within the opening 16 is a die pad 18 of the lead frame 12. Though not shown in FIG. 1, the die pad 18 is typically connected to the outer frame portion 14 by a plurality of tie bars 15 of the lead frame 12 which extend between the outer frame portion 14 and respective ones of the four corner regions typically defined by the die pad 18. The tie bars 15 facilitate the stable support of the die pad 18 inside the outer frame portion 14, and more particularly within the opening 16 defined thereby.

Each lead frame 12 further comprises a multiplicity of leads 20 which are integrally connected to the outer frame portion 14 and protrude therefrom into the opening 16 toward the peripheral edge of the die pad 18. The leads 28 are typically segregated into four equal sets, with each set being disposed in spaced relation to a respective one of the four peripheral edge segments defined by the die pad 18. Each lead 20 defines a distal, inner end 22 which, as indicated above, is disposed in spaced relation to the peripheral edge of the corresponding die pad 18. As further seen in FIG. 1, each lead 20 has a generally rectangular configuration, and defines an opposed pair of longitudinal side surfaces 24. The inner end 22 extends perpendicularly between the side surfaces 24, and itself defines a lateral side surface of the lead 20. Each lead 20 further defines a top surface 26 (shown in FIGS. 2 and 3) and an opposed bottom surface 28. The bottom surfaces 28 of the leads 20 are shown in FIG. 1.

In each array within the strip 10, the outer frame portions 14 of the lead frames 12 are integrally connected to each other such that the lead frames 12 of each array are arranged in a matrix wherein the leads 20 thereof extend in multiple rows and columns. As further seen in FIG. 1, each set of leads 20 within each column and row extends in opposed, spaced relation to a set of leads 20 of an adjacent lead frame 12 within the same column or row, with the adjacent sets of leads 20 being separated from each other by a gap G collectively defined by portions of the corresponding, integrally connected outer frame portions 14 of the lead frames 12. Formed in each gap G of the strip 10 are a plurality of elongate slots 30. Each slot 30 extends across the corresponding gap G between a respective opposed pair of leads 20. Each slot 30 is sized such that the opposed ends thereof extend or protrude into each of the leads 20 of the corresponding pair for reasons which will be discussed in more detail below.

The strip 10 typically comprises a first layer which is formed from an insulating material (e.g., a molding compound), and a second layer which is applied to the first layer and formed from a conductive metallic material (e.g., copper). The second layer defines the lead frames 12 and slots 30. The second layer of the strip 10 is preferably formed by chemical etching, with the slots 30 being formed through the implementation of a half-etched technique. In this regard, wherein the first layer is exposed within the opening 16, the slots 30 do not extend all the way to the first layer.

In the strip 10, each gap G (collectively defined by sections of the outer frame portions 14 as indicated above), portions of the leads 20 extending thereto, and the slots 30 formed therein collectively define a saw street S of the strip 10. Due to the arrangement of the lead frames 12 in a matrix within each array of the strip 10, multiple lateral and longitudinal saw streets S are defined within the strip 10. In the manufacture of integrated circuit chip packages from the strip 10, the passage of a cutting blade along each saw street S separates the lead frames 12 from each other. During the saw singulation process used to separate the lead frames 12 from each other, the saw blade cutting along each saw street S removes the metal material collectively defined by the outer frame portions 14 in each gap G, and further removes or severs a portion of each lead 20 disposed furthest from the corresponding die pad 18. Additionally, the saw blade passes through each slot 30 within each gap G. As it cuts along each saw street S, the saw blade is always cutting the metal within the gap G, though the amount of metal cut is reduced when the saw blade passes through the aligned spaces separating the leads 20 from each other (such spaces including only the first layer due to the complete etching of the metal second layer) and the slots 30 (attributable to the reduced thickness facilitated by the half-etched second layer).

Figure 2:
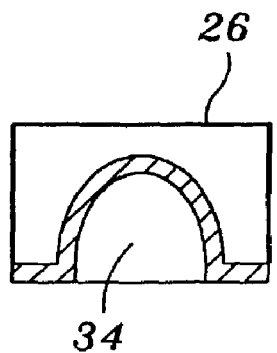
FIG. 2 is a cross-sectional view taken along line A—A of FIG. 1.
Figure 3:
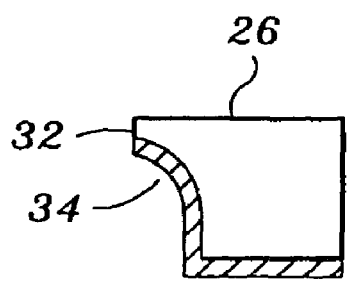
FIG. 3 is a cross-sectional view taken along line B—B of FIG. 1.
Figure 10:
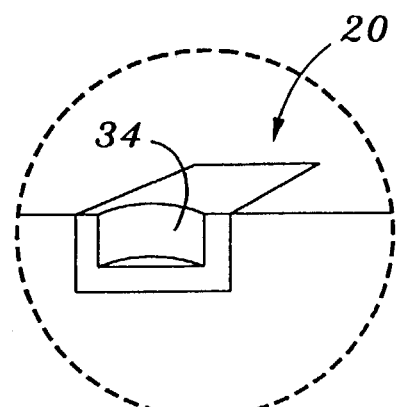
FIG. 10 is an enlargement of the encircled region B shown in FIG. 9.

Referring now to FIGS. 2, 3 and 10, the completion of the saw singulation process results in each lead 20 of each separated lead frame 12 being formed to include an outer end 32 which is disposed in opposed relation to the corresponding inner end 26 and defines another lateral side surface of the lead 20. As indicated above, the opposed ends of each slot 30 are formed within the strip 10 so as to extend into the leads 20 of each opposed pair extending to the corresponding gap G. The width of the saw blade used in the saw singulation process is such that each saw street S does not include the opposed end portions of each slot 30. Thus, as best seen in FIGS. 2, 3, 9 and 10, the completion of the saw singulation process results in a recess 34 being formed within each lead 20. Each recess 34 is formed in a corner region of the corresponding lead 20 collectively defined by the outer end 32 and bottom surface 28 thereof. In this regard, the recess 34 is disposed within the bottom surface 28 and outer end 32, but does not extend to the top surface 26 or either of the side surfaces 24. Additionally, the innermost end of each recess 34 is disposed in spaced relation to the inner end 22 of the corresponding lead 20. The use of the recesses 34 will be discussed in more detail below.

Figure 4:
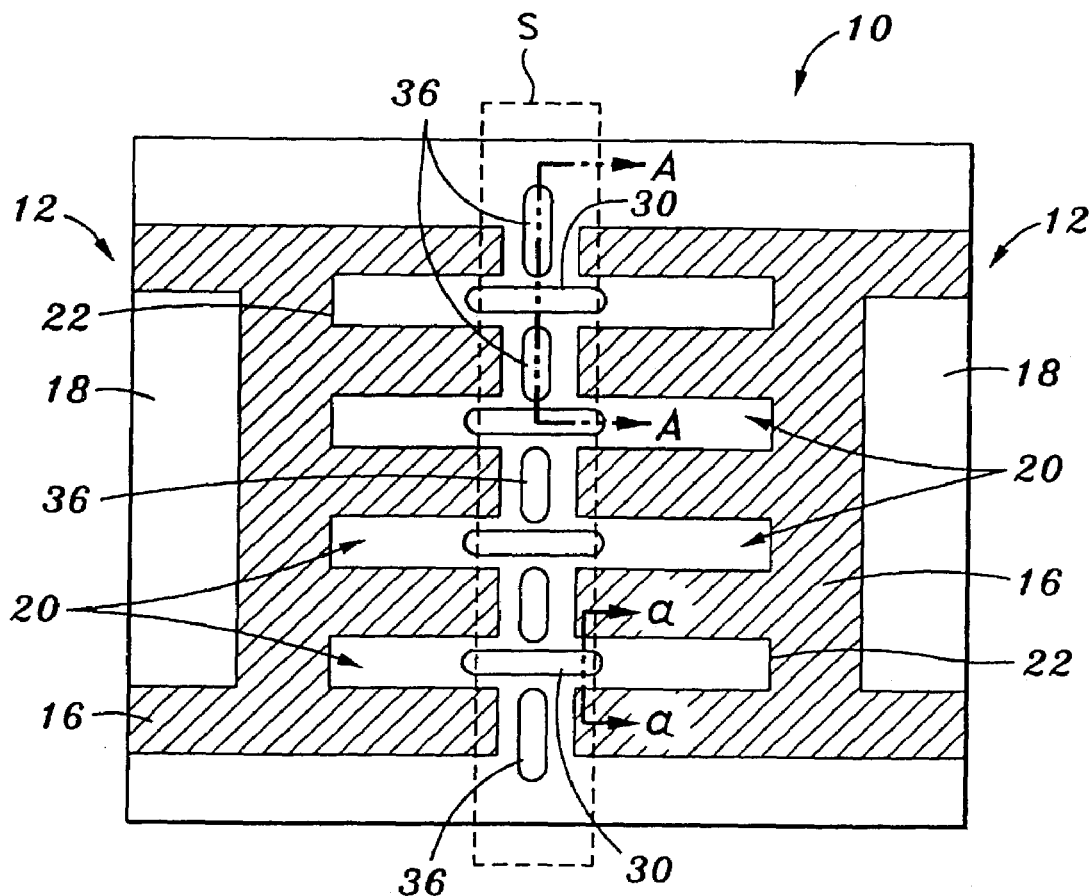
FIG. 4 is a partial top plan view of the lead frame strip shown in FIG. 1 as modified to improve the efficiency of a saw singulation process used to separate the individual lead frames within the lead frame strip from each other.
Figure 5:
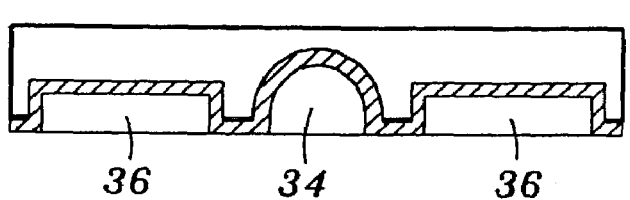
FIG. 5 is a cross-sectional view taken along line A—A of FIG. 4.
Figure 6:
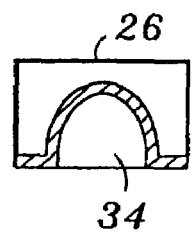
FIG. 6 is a cross-sectional view taken along line a—a of FIG. 4.

Referring now to FIGS. 4–6, it is contemplated that to further improve sawing efficiency in the saw singulation process, the strip 10 may further be formed to include a plurality of secondary slots 36 which extend in alignment within each gap G. More particularly, as best seen in FIG. 4, each secondary slot 36 extends along an axis bisecting the corresponding gap G. Thus, each secondary slot 36 extends perpendicularly relative to the slots 30, with certain ones of the secondary slots 36 extending between adjacent pairs of the slots 30. The secondary slots 36 may also be formed via a half-etched technique within the second layer of the strip 10 in the same manner the slots 30 are formed therein. Alternatively, the secondary slots 36 may be formed by completely etching the second layer, thus causing the first layer to be exposed within the secondary slots 36. Irrespective of whether they are formed by a half-etched technique or completely etching the second layer of the strip 10, the inclusion of the secondary slots 36 within the strip 10 further reduces the amount of metal material within each saw street S which must be removed by the saw blade during the saw singulation process. Such reduced amount of metal material within the saw street S increases sawing efficiency and prolongs saw blade life, thus reducing premature blade wear and providing a substantial cost benefit.

In addition to the slots 30 (alone or in combination with the secondary slots 36) increasing saw efficiency in the saw singulation process due to the resultant reduction of copper or other metal material in each saw street S, the slots 30 further reduce the cut line interface between the saw blade and each of the leads 20, thus reducing the amount of burring which typically occurs as a result of the saw singulation process. As indicated above, saw generated burrs at the seating plan of each lead 20 in the lead frame 12 adversely affect solder mounting and joint reliability. In current semiconductor package fabrication methodologies, lead burrs are controlled by limiting the feed rate of the saw blade along each saw street S and by using specifically developed, high cost saw blades. The reduced burring attributable to the inclusion of the slots 30 within the strip 10 increases output and allows for the use of lower cost saw blades, thereby providing a further increased cost benefit. Stated another way, the reduced area of those portions of each of the leads 20 which are cut by the saw blade during the saw singulation process attributable to the removal of metal material by the formation of the slots 30 in turn reduces the area of the leads 20 susceptible to burring.

Referring now to FIGS. 7–10, there is depicted a semiconductor package 40 fabricated to include the lead frame 12 of the present invention. The semiconductor package 40 includes a package body 42 which is formed by the hardening of the plastic encapsulant material which is applied to the lead frame strip 10. As will be recognized, the saw singulation process which effectively separates the lead frames 12 of the strip 10 from each other also facilitates the cutting of the plastic encapsulant material in a manner completing the formation of the package body 42 of each semiconductor package 40. The completely formed package body 42 defines a top surface 44 and an opposed bottom surface 46. The package body 42 further defines a generally planar shelf or shoulder 48 which is perpendicularly recessed relative to the top surface 44 and extends in generally parallel relation thereto. Extending perpendicularly between the shoulder 48 and the bottom surface 46 is a peripheral side surface 50 of the package body 42.

Figure 7:
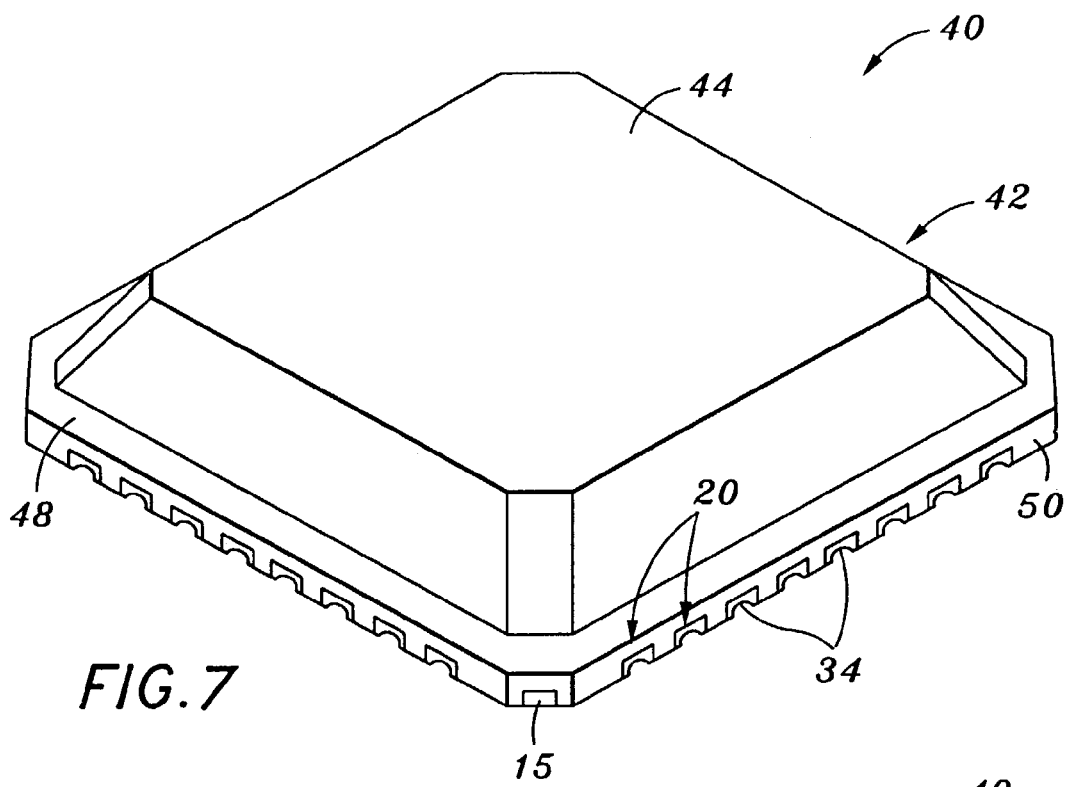
FIG. 7 is a top perspective view of a semiconductor package formed to include the lead frame of the first embodiment of the present invention.
Figure 8:
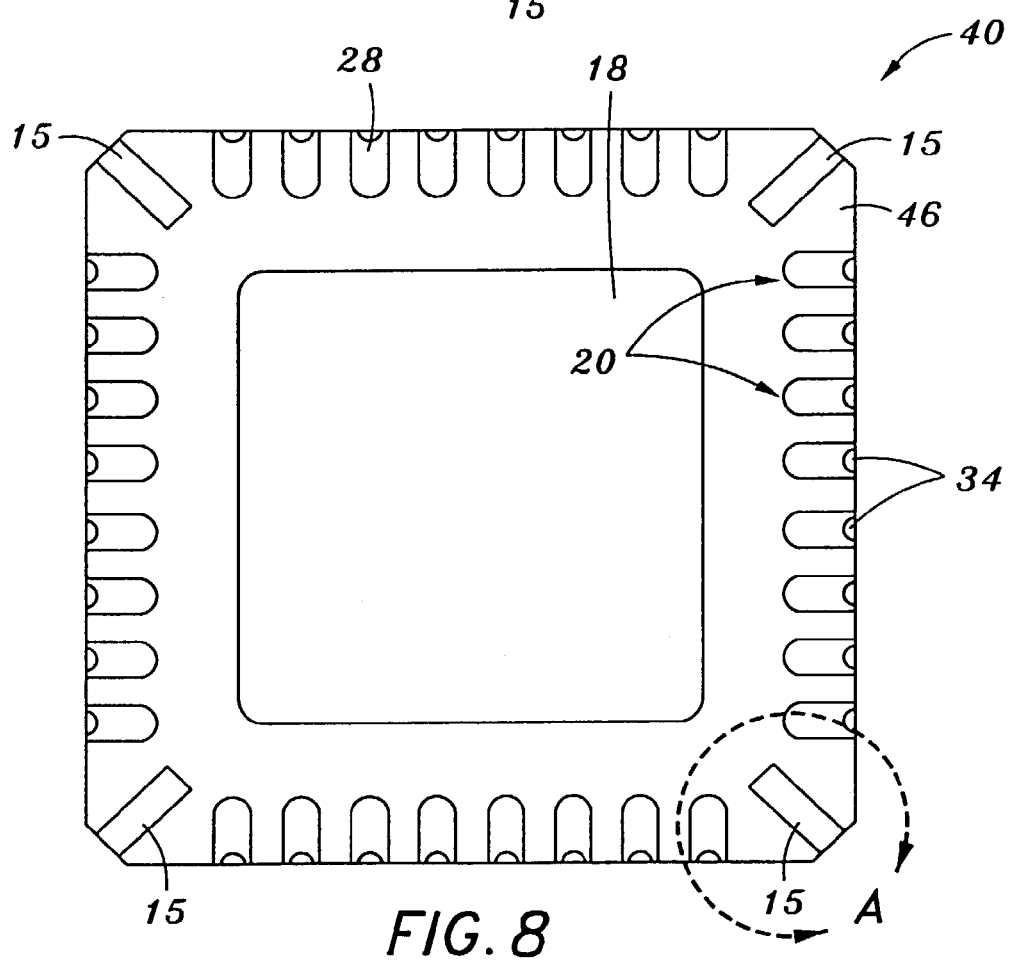
FIG. 8 is a bottom plan view of the semiconductor package shown in FIG. 7.
Figure 9:
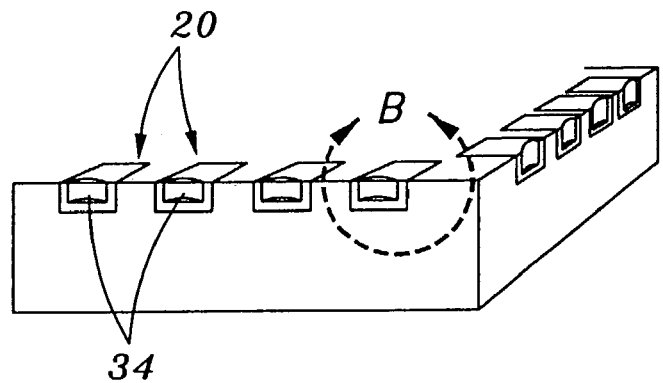
FIG. 9 is a partial perspective view of the encircled region A shown in FIG. 8.

The package body 42 of the semiconductor package 40 is applied to the lead frame 12 such that the bottom surface of the die pad 18 is exposed within the bottom surface 46 of the package body 42. Additionally, at least portions of the bottom surfaces 28 of the leads 20 of the lead frame 12 are exposed within the bottom surface 46 of the package body 42, with the outer ends 32 of the leads 20 being exposed within the side surface 50 of the package body 42. Thus, each of the recesses 34 is fully exposed within the semiconductor package 40. The inner ends 22, side surfaces 24 and top surfaces 26 of the leads 20 are covered by the package body 42, as are the top and side surfaces of the die pad 18. As shown in FIGS. 7 and 8, the package body 42 may be formed such that the bottom surfaces of the above-described tie bars 15 used to connect the die pad 18 to the outer frame portion 14 are exposed within respective ones of the four corner regions of the bottom surface 46 of the package body 42. The outer ends of the tie bars may be exposed within the side surface 50 of the package body 42, with the inner ends, top surfaces and side surfaces of the tie bars 15 being covered by the package body 42. In the semiconductor package 40, the bottom surface 28 and outer end 32 of each lead 20 (which are exposed within the package body 42) preferably include a plating layer of a predetermined thickness plated thereon. Such plating layer is typically a metal such as copper, gold, solder, tin, nickel, palladium, or others. The plating layer will also coat or be applied to those surfaces of each lead 20 defining the recess 34 therein.

Figure 11:
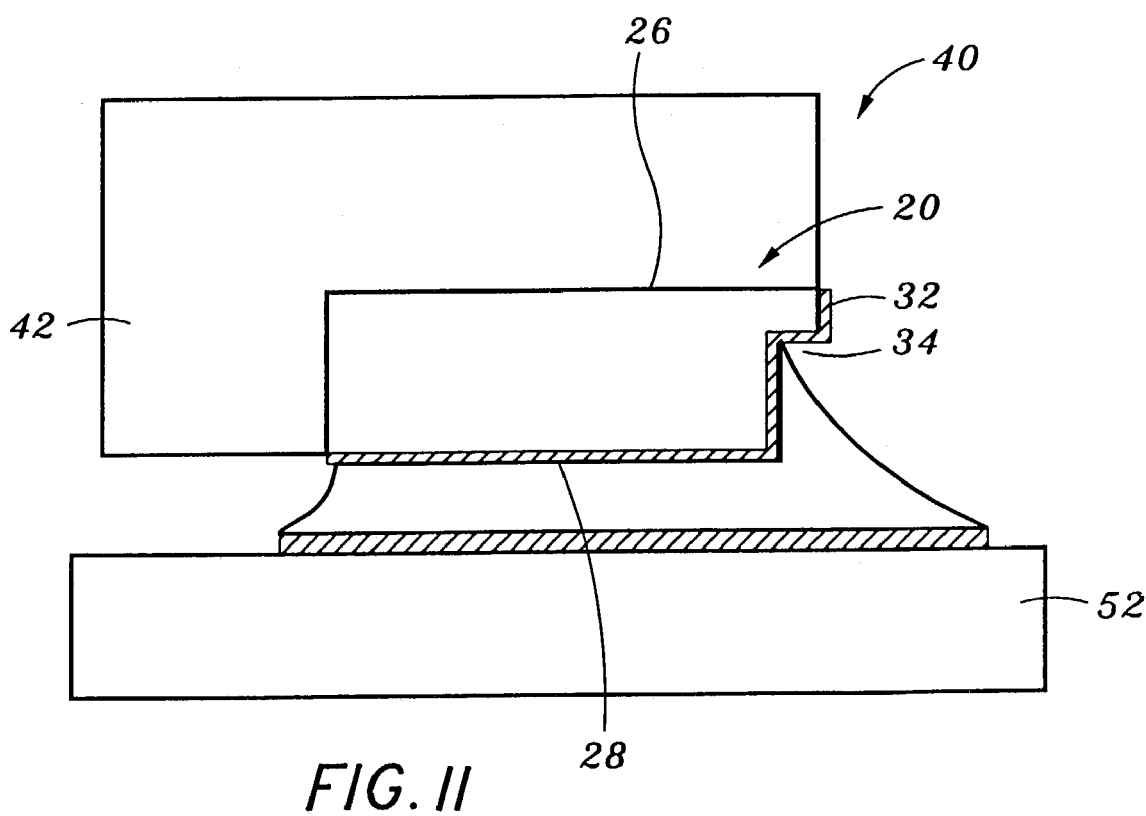
FIG. 11 is a partial, side-elevational view illustrating the manner in which the semiconductor package shown in FIGS. 7–10 is mounted to a printed circuit board.

Referring now to FIG. 11, as indicated above, in current chip package designs, solderable surfaces used to facilitate the electrical connection of the chip package to a printed circuit board are provided by only the exposed bottom surfaces of the leads. The chip package is attached to the printed circuit board by printing solder paste on the board, positioning the exposed bottom surfaces of the leads upon the solder paste, and completing a hot reflow process. However, the limited solderable area of the chip package and resultant decreased solder joint strength gives rise to reliability problems concerning the potential failure of one or more of the solder joints between the chip package and the printed circuit board. The inclusion of the recesses 34 in the leads 20 within the semiconductor package 40 allows solder to reflow up the outer ends 32 of the leads 20 (within the recesses 34) during the hot reflow process, thereby increasing the overall solder joint strength and reliability between the semiconductor package 40 and the printed circuit board 52 as shown in FIG. 11. The inclusion of the recesses 34 within the leads 20 increases the solderable area of the leads 20 to the printed circuit board 52, with the final solder joint being stronger with increased second level reliability.

Figure 12:
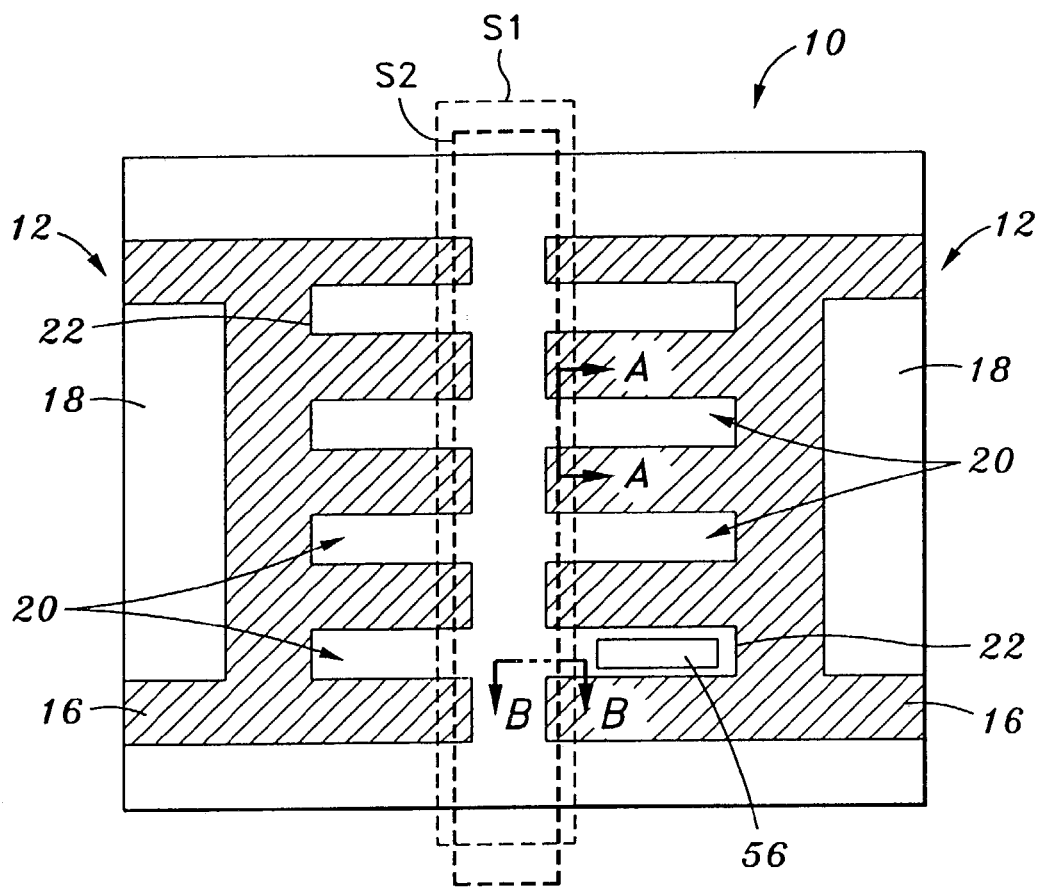
FIG. 12 is a partial top plan view of a lead frame strip defining multiple lead frames formed in accordance with a second embodiment of the present invention.
Figure 13:
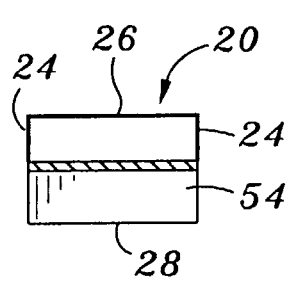
FIG. 13 is a cross-sectional view taken along line A—A of FIG. 12.

Referring now to FIGS. 12–14C, in accordance with a second embodiment of the present invention, it is contemplated that the leads 20 may be formed to include alternatively configured recesses 54 within the corner region of each lead 20 collectively defined by the outer end 32 and bottom surface 28 thereof. The alternatively configured recesses 54 are formed via a sequence of saw cuts. In this regard, the strip 10 used to form the lead frames 12 having the leads 20 which include the recesses 54 does not include the slots 30 or the secondary slots 36 discussed above. As seen in FIGS. 12 and 14A, the recesses 54 are formed by the completion of a first saw cut S1 wherein the saw blade cuts into the bottom surfaces 28 of those portions of the leads 20 of adjacent lead frames 12 extending to a common gap G. As seen in FIG. 14A, the metal removed by this first saw cut amounts to approximately half the total thickness of the leads 20. Subsequent to the completion of the first saw cut, the bottom surfaces 28 of the leads 20 are plated, as are those surfaces of each lead 20 formed or defined by the first saw cut S1.

Figure 14A:
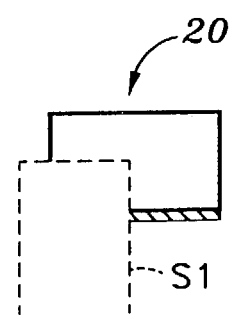
FIGS. 14A, 14B, 14C are cross-sectional views taken along line B—B of FIG. 12, illustrating a sequence of saw cutting steps through which the lead frame of the second embodiment is formed.
Figure 14B:
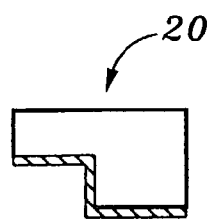
Figure 14C:
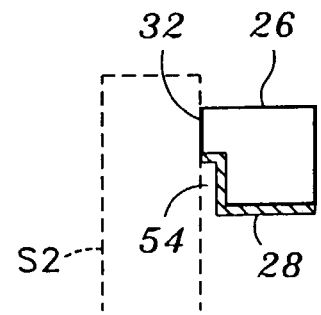

As seen in FIGS. 12 and 14C, upon the completion of the plating process, a second saw cut S2 is completed through the use of a saw blade which is thinner than that used to complete the first saw cut S1. The second saw cut S2 cuts through the entire strip 10, thereby effectively separating the lead frames 12 from each other. The second saw cut S2 further completely removes portions of each of the leads 20 in a manner facilitating the formation of the outer ends 32 thereof and the recesses 54 within the outer ends 32 and bottom surfaces 28. Each recess 54 has a generally rectangular configuration and extends to each of the side surfaces 24.

The recesses 54 formed in accordance with the second embodiment of the present invention provide the same functionality as the recesses 34, i.e., allow solder to reflow up the ends of the leads 20 within the recesses 54. However, the formation of the recesses 54 via the two-pass saw process does not provide the same saw cut efficiency and reduced burring attributes as result from the formation of the recesses 34 through the use of the slots 30.

Further in accordance with the present invention, it is contemplated that the leads 20 of each of the lead frames 12 may have a solder bump 56 formed thereon prior to any saw singulation of the strip 10 either along the saw street S or first and second saw cuts S1, S2. Exemplary solder bumps 56 formed on one of the leads 20 are shown in FIGS. 1 and 12. If the solder bumps 56 are to be pre-formed on each of the leads 20 including the recesses 34, the singulation of the strip 10 to separate the lead frames 12 from each other and thus complete the fabrication of the semiconductor packages will occur in a two-step process. In the first step, an "iso cut" will be completed along the saw street S. As a result of this initial cut, the conductive metal material (e.g., copper) of the second layer is removed along the saw street S, with the insulating material of the first layer being left intact. Upon the completion of the iso cut, the solder bumps 56 are applied to the leads 20 of each of the lead frames 12. Thereafter, a second cut is completed along the saw street S by a saw blade which is thinner than the saw blade used to complete the iso cut. In the second, follow-up sawing process, the saw blade cuts only through the first layer due to the removal of the second layer as a result of the iso cut. The use of a thinner blade for completing the second cut prevents any burring or smearing of the solder bumps 56 which could extend to the saw street S. The completion of the second cut completes the saw singulation of the strip 10 and completes separation of the lead frames 12 from each other.

If the solder bumps 56 are to be pre-formed on each of the leads 20 including the recesses 54, the complete fabrication of the semiconductor packages will occur in a three-step process. The first step would entail the completion of the first saw cut S1 described above in relation to FIG. 14A. Thereafter, the second saw cut S2 previously described in relation to FIG. 14C would be completed. However, the second saw cut S2 would be completed in a manner wherein only the conductive metal material of the second layer is removed, with the insulating material of the first layer in the strip 10 being left intact. Upon the completion of such modified second saw cut S2, the solder bumps 56 are applied to the leads 20 of the lead frame 12. Thereafter, a third saw cut is completed along essentially the same path as the second saw cut S2, with the saw blade cutting only through the first layer due to the removal of the second layer as a result of the second cut saw S2. The blade used to complete the third saw cut will typically be slightly thinner than the blade used to complete the second saw cut S2.

The leads 20 of the lead frames 12 may each be provided with the solder bump 56 without necessarily completing the saw singulation of the strip in the aforementioned two-step or three-step process. In this regard, the solder bumps 56 could simply be formed on each of the leads 20, with the cuts being completed in the manners previously described in relation to the first and second embodiments of the present invention. However, if the solder bumps 56 are to be formed on the leads 20 prior to the single cut (in the case of the first embodiment) or the two-step cut (in the case of the second embodiment), such solder bumps 56 must be carefully positioned on the leads 20 so that the saw singulation process does not cause excessive burring or smearing thereof.

The solder bumps 56 are typically created by screen printing solder paste on the leads 20, and are optimized for reworkability and second level reliability. In current chip package designs, solderable surfaces are provided by the bottom surfaces of the leads as indicated above, with the chip package being attached to the printed circuit board by printing solder paste on the board and completing a hot reflow process. Thus, the solder joint standoff height is completely dependent upon the amount of paste printed on the printed circuit board. The solder bumps 56, if included on the leads 20, increase the standoff by two or three mils, thus enhancing solder joint reliability. Additionally, the rework process at the printed circuit board level involves removing the old component, printing paste on the printed circuit board at the component site, and attaching a new component. For tight spaces, it is very difficult to print paste on the printed circuit board, with the joint formation usually being relied upon by solder balls on CSP packages. This poses a challenge for MLF packages as there are no solder balls on the package. By creating solder bumps 56 on the semiconductor package 40, the same will not require solder paste printing on the printed circuit board for reworking.

The portion of the semiconductor package 40 shown in FIG. 11 represents what is typically referred to as a conventional "full lead design". As is evident from the aforementioned description of the semiconductor package 40, in the full lead design, at least portions of the bottom surfaces 28 of the leads 20 are exposed within the bottom surface 46 of the package body 42, with the outer ends 32 of the leads 20 being exposed within the side surface 50 of the package body 42. This full lead design provides optimal solder joint reliability due to the large solder fillet formed at the outer ends 32 of the leads 20. These solder fillets are enhanced by the inclusion of the recesses 34 within the outer ends 32 of the leads 20. However, the full lead design still carries a saw efficiency penalty attributable to the need to pass the saw blade through the metal material within each saw street S and the susceptibility of creating burrs at the outer ends 32 of the leads 20 as a result of the saw singulation process which are outside of an acceptable size range.

Figure 15:
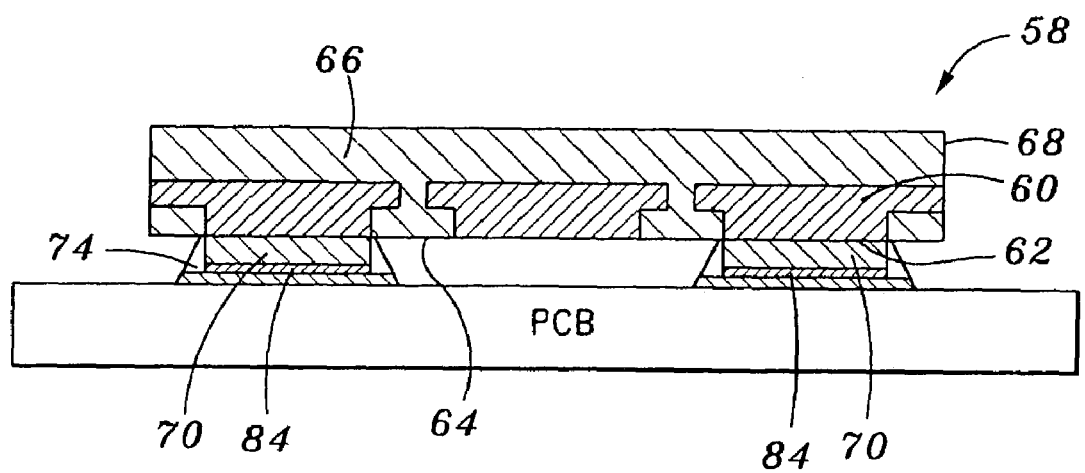
FIG. 15 is a cross-sectional view of a semiconductor package having a modified in-board design to define solder fillets created by copper bumps in accordance with another aspect of the present invention.

Referring now to FIG. 15, there is shown a semiconductor package 58 which has an "inboard lead design" as an alternative to the full lead design of the semiconductor package 40. In the inboard lead design, the semiconductor package 58 includes leads 60, each of which includes a bottom surface 62. The bottom surface 62 of each lead 60 is exposed within the bottom surface 64 of the package body 66 of the semiconductor package 58, but is pulled back away from the side surface 68 of the package body 66. The exposed bottom surfaces 62 of the leads 60 define contact points for solder paste used to form solder joints used to electrically connect the leads 60 and hence the semiconductor package 58 to an underlying substrate such as a printed circuit board. The inboard lead design of the semiconductor package 58 optimizes saw singulation efficiency due to the substantially decreased amount of metal which must be removed during the saw singulation process. However, due to the bottom surfaces 62 of the leads 60 being substantially flush with the bottom surface 64 of the package body 66, the solder joint reliability between the semiconductor package 58 and an underlying substrate is inferior to that typically achieved between a semiconductor package having a full lead design and an underlying substrate.

The semiconductor package 58 of the inboard lead design as shown in FIG. 15 includes certain enhancements to a typical inboard lead design which are adapted to facilitate a substantial increase in solder joint reliability as compared to the typical inboard lead design. More particularly, as shown in FIG. 15, the exposed bottom surface 62 of each lead 60 has a bump 70 plated thereon. The bump 70 is preferably formed of copper. The application of the copper bump 70 to the bottom surface 62 of each lead 60 preferably occurs upon the completion of the formation of the package body 66 via a molding process. Each copper bump 70 may include a solder plate 84 formed thereon. The copper bump 70 provides an increased solderable area that provides a desired solder fillet increasing the second level reliability of the solder joints between the semiconductor package 58 and the underlying substrate such as the printed circuit board 72 shown in FIG. 15. As shown in FIG. 15, the solder paste 74 used to form the solder joints between the semiconductor package 58 and the printed circuit board 72 is able to flow up the sides of the copper bump 70 so as to provide the aforementioned increase in second level reliability. Thus, the modified inboard design of the semiconductor package 58 attributable to the inclusion of the copper bumps 70 upon the bottom surfaces 62 of the leads 60 provides the attributes of good solder joint reliability coupled with greater efficiency in the saw singulation process.

Figure 16A:
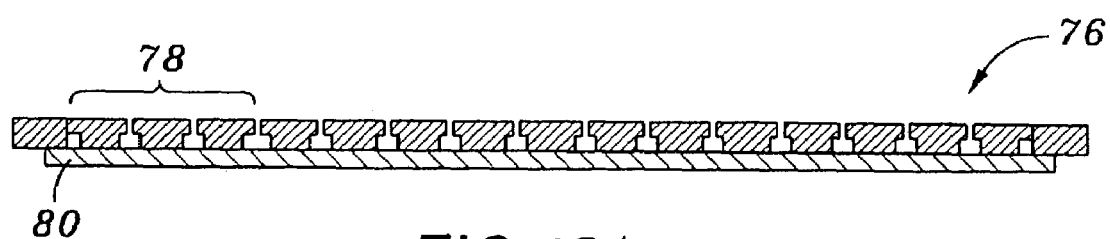
FIGS. 16A–16F are cross-sectional views illustrating a sequence of steps which may be used to fabricate the semiconductor package shown in FIG. 15.
Figure 16B:
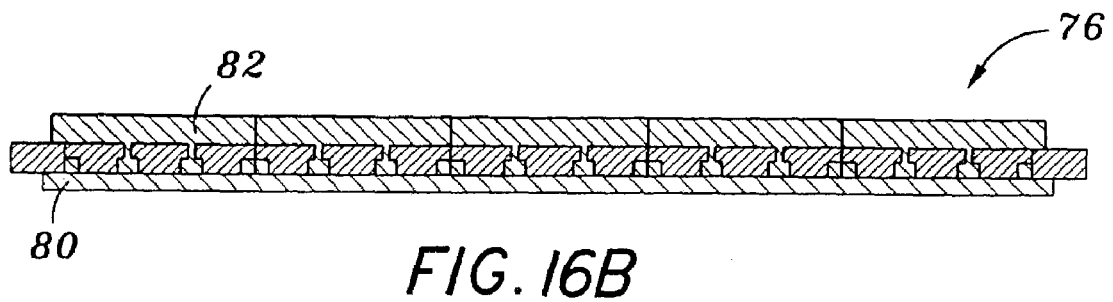

Referring now to FIGS. 16A–F, there is shown a sequence of steps used to facilitate the fabrication of semiconductor packages 58 having the modified inboard design described above. In the initial stage of the fabrication process, a metallic lead frame strip 76 defining multiple lead frames 78 has a tape layer 80 applied to one side thereof (FIG. 16A). Thereafter, a mold cap 82 is formed upon the lead frames 78 (FIG. 16B). Those surfaces of the leads and die pad of each lead frame 78 of the lead frame strip 76 which are covered by the tape layer 80 are not covered by the mold cap 82.

Figure 16C:
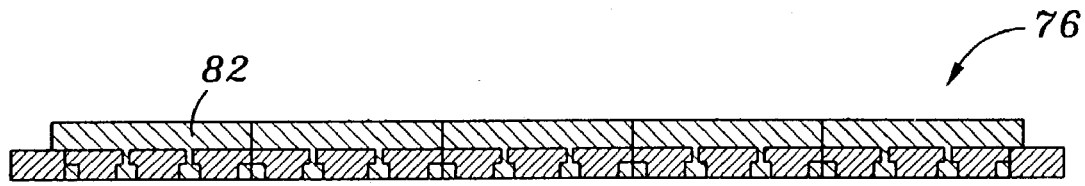
Figure 16D:
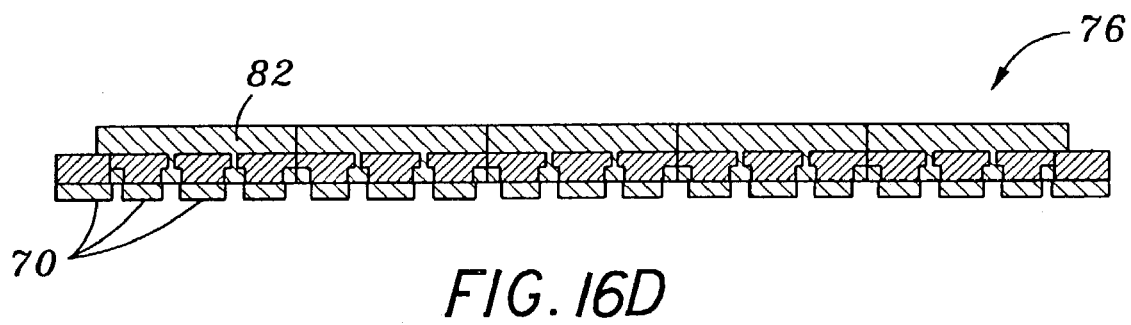
Figure 16E:
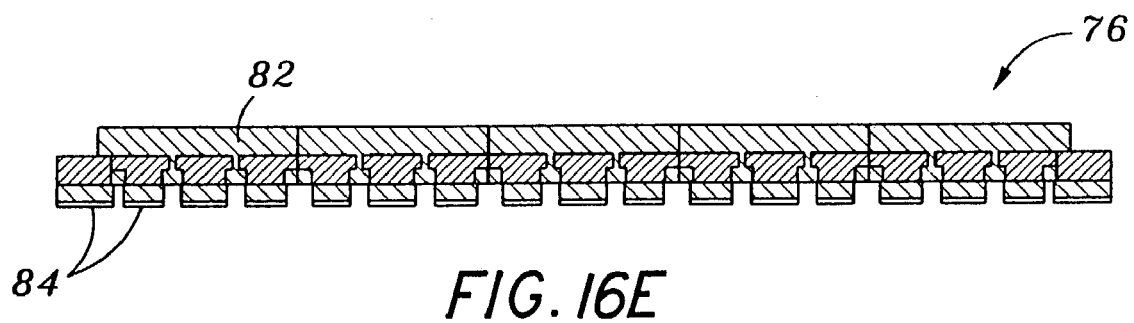
Figure 16F:
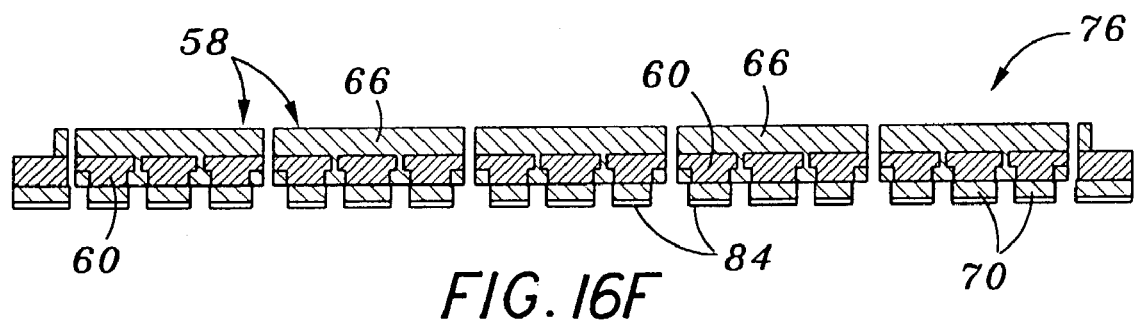

Subsequent to the formation of the mold cap 82, the tape layer 80 is removed from the lead frame strip 76 (FIG. 16C). Thereafter, the above-described copper bump 70 is formed on the exposed bottom surface of each of the leads of each of the lead frames 78 (FIG. 16D). As shown in FIG. 16D, copper bumps 70 are also formed on the bottom surfaces of the die pads of the lead frames 78 which are also exposed within the mold cap 82. After the copper bumps 70 have been formed, a solder plate 84 is formed on each of the copper bumps 70 (FIG. 16E). Subsequent to the formation of the solder plates 84, the lead frame strip 76 and mold cap 82 are subjected to a saw singulation process along the saw streets defined thereby so as to separate the individual semiconductor packages 58 from each other (FIG. 16F). Each of the resultant semiconductor packages 58 has the structural attributes described above in relation to FIG. 15.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:
    a die pad defining a bottom surface;
    a plurality of leads extending at least partially about the die pad in spaced relation thereto, each of the leads defining:
        opposed top and bottom surfaces; and
        an outer end;
    a semiconductor chip attached to the die pad and electrically connected to at least one of the leads;
    a package body defining a generally planar bottom surface and partially encapsulating the die pad, the leads and the semiconductor chip such that at least a portion of the bottom surface of each of the leads is exposed in and substantially flush with the bottom surface of the package body; and
    means formed on the exposed portion of the bottom surface of each of the leads for increasing a stand-off height of the semiconductor package from an underlying substrate and providing an increased solderable area to create a solder fillet when solder is used to attach the semiconductor package to the substrate, the stand-off means being formed of a conductive material having a melting point higher than that of solder; and
    a solder plate disposed on the stand-off means.

2. The semiconductor package of claim 1 wherein the stand-off means is further formed on the bottom surface of the die pad.

3. The semiconductor package of claim 2 wherein the stand-off means comprises a bump formed on the exposed portion of the bottom surface of each of the leads and the bottom surface of the die pad.

4. The semiconductor package of claim 3 wherein the bump comprises copper.

5. The semiconductor package of claim 3 wherein the bump is formed by a plating process.

6. The semiconductor package of claim 1 wherein
    the bottom surface of the die pad is exposed in and substantially flush with the bottom surface of the package body.

7. The semiconductor package of claim 6 wherein:
    the package body defines multiple generally planar side surfaces;
    the outer end of each of the leads is exposed in and substantially flush with a respective one of the side surfaces.

8. A semiconductor package comprising:
    a die pad defining a bottom surface;
    a plurality of leads extending at least partially about the die pad in spaced relation thereto, each of the leads defining:
        opposed top and bottom surfaces; and
        an outer end;
    a semiconductor chip attached to the die pad and electrically connected to at least one of the leads;
    a package body defining a generally planar bottom surface and partially encapsulating the die pad, the leads and the semiconductor chip such that the at least a portion of the bottom surface of each of the leads is exposed in and substantially flush with the bottom surface of the package body;
    a bump disposed on the exposed portion of the bottom surface of each of the leads, the bump being formed of a conductive material having a melting point higher than that of solder, and being sized and configured to increase a stand-off height of the semiconductor package from an underlying substrate and to provide an increased solderable area to create a solder fillet when solder is used to attach the semiconductor package to the substrate; and
    a solder plate disposed on the bump.

9. The semiconductor package of claim 8 wherein a bump formed of a conductive material having a melting point higher than that of solder is further disposed on the bottom surface of the die pad and includes a solder plate disposed thereon.

10. The semiconductor package of claim 9 wherein the bump comprises copper.

11. The semiconductor package of claim 9 wherein the bump is formed by a plating process.

12. The semiconductor package of claim 8 wherein
    the bottom surface of the die pad is exposed in and substantially flush with the bottom surface of the package body.

13. The semiconductor package of claim 12 wherein:
    the package body defines multiple generally planar side surfaces;
    the outer end of each of the leads is exposed in and substantially flush with a respective one of the side surfaces.

14. In a semiconductor package comprising a die pad defining a bottom surface, a plurality of leads which each define a bottom surface and extend at least partially about the die pad in spaced relation thereto, a semiconductor chip attached to the die pad and electrically connected to at least one of the leads, and a package body defining a generally planar bottom surface and at least partially encapsulating the die pad, the leads, and the semiconductor chip such that the bottom surface of each of the leads is exposed in and substantially flush with the bottom surface of the package body, the improvement comprising:
    means formed on the bottom surface of each of the leads for increasing a stand-off height of the semiconductor package from an underlying substrate and providing an increased solderable area to create a solder fillet when solder is used to attach the semiconductor package to the substrate, the stand-off means being formed of a conductive material having a melting point higher than that of solder.

15. The semiconductor package of claim 14 wherein the stand-off means is further formed on the bottom surface of the die pad.

16. The semiconductor package of claim 15 wherein the stand-off means comprises a bump formed on the bottom surface of each of the leads and the bottom surface of the die pad.

17. The semiconductor package of claim 16 wherein the bump comprises copper.

18. The semiconductor package of claim 14 wherein the bump is formed by a plating process.

19. The semiconductor package of claim 14 wherein the bottom surface of the die pad is exposed in and substantially flush with the bottom surface of the package body.

20. The semiconductor package of claim 19 wherein:
the package body defines multiple side surfaces; and
each of the leads defines an outer end which is exposed in and substantially flush with a respective one of the side surfaces.

* * * * *